United States Patent [19]

Trisno

[11] Patent Number: 5,210,633
[45] Date of Patent: May 11, 1993

[54] APPARATUS AND METHOD FOR LINEARIZING THE OPERATION OF AN EXTERNAL OPTICAL MODULATOR

[75] Inventor: Yudhi Trisno, Newtown, Pa.

[73] Assignee: General Instrument Corporation, Hatboro, Pa.

[21] Appl. No.: 581,015

[22] Filed: Sep. 12, 1990

[51] Int. Cl.$^5$ .......................... G02B 6/10; G02F 1/01; H04B 10/12
[52] U.S. Cl. ..................................... 359/194; 369/107
[58] Field of Search ........................... 359/194; 385/3; 455/278; 369/107

[56] References Cited

U.S. PATENT DOCUMENTS

| | | | |
|---|---|---|---|
| 4,075,474 | 2/1978 | Straus et al. | 359/194 |
| 4,149,071 | 4/1979 | Nagai et al. | 359/194 |
| 4,588,958 | 5/1986 | Katz et al. | 330/149 |
| 4,699,466 | 10/1987 | Brandstetter et al. | 369/107 |
| 4,715,021 | 12/1987 | Dittert | 367/41 |
| 4,752,743 | 6/1988 | Pham et al. | 330/149 |
| 5,003,624 | 3/1991 | Terbrack et al. | 455/278 |
| 5,012,475 | 4/1991 | Campbell | 372/29 |
| 5,031,235 | 7/1991 | Raskin et al. | 455/278 |

FOREIGN PATENT DOCUMENTS 0037857 4/1980 European Pat. Off. .

OTHER PUBLICATIONS

Childs et al; CED, vol. 16, No. 5, pp. 91-92, 95; May 1, 1990.
Childs et al; IEEE J. Sel. Areas Commun., vol. 8, #7, pp. 1369-1376; Sep. 1, 1990.
Bertlsmeir et al; Frequenz (Germany); vol. 38, #9, pp. 206-212, Sep. 1984.
B. Widrow et al, "Adaptive Signal Processing", 1985, Prentice Hall, Inc., pp. 9-11.
R. E. Patterson, J. Straus, G. Blenman and T. Witkowicz, "Linearization of Multichannel Analog Optical Transmitters by Quasi-Feedforward Compensation Technique", *IEEE Trans. on Comm.*, vol. COM-27, No. 3, Mar. 1979, pp. 582-588.

Primary Examiner—Nelson Moskowitz
Attorney, Agent, or Firm—Barry R. Lipsitz

[57] ABSTRACT

A modulating signal is predistorted to linearize the output of an optical intensity modulator. The modulating signal is split into first and second paths. In the first path, the signal is phase shifted. In the second path, distortion components are introduced. The phase shifted signal from the first path is then combined with the distorted signal from the second path to provide a predistorted signal for use in modulating a light source. The distortion generator can comprise a diode pair coupled with opposite polarities in parallel. Both diodes are forward biased, and the pair is coupled in series with the input signal to provide the desired predistortion.

17 Claims, 5 Drawing Sheets

APPARATUS AND METHOD FOR LINEARIZING THE OPERATION OF AN EXTERNAL OPTICAL MODULATOR

BACKGROUND OF THE INVENTION

The present invention relates to analog optical transmission systems, and more particularly to an apparatus and method for predistorting a modulation signal to provide linear operation of an external optical modulator.

Optical transmission systems are currently being implemented for use in various communication applications. For example, telephone systems are now in use that utilize optical fiber technology to transmit voice and data signals over long distances. Similarly, cable television networks are now available where an optical fiber technology is used for the transmission of both analog and digital signals.

Prior to the implementation of optical transmission networks, cable television programs were carried as radio frequency ("RF") signals over electrical coaxial cables. In such systems, it is usually necessary to transmit signals over long distances. Since the strength of transmitted signals decreases in proportion to the length of the cable over which the signals are transmitted, amplification at repeated intervals along the cable is necessary to maintain adequate signal strength. The electronic amplifiers used for this purpose inherently distort the signals as they are being amplified. Harmonic distortion, in particular, results from nonlinearities in the amplifier that cause harmonics of the input frequencies to appear in the output. Other components in the communication network can similarly introduce distortion components.

One solution to the distortion problem in coaxial cable RF communication systems has been to use "feedforward" amplifiers to amplify the signals at repeated intervals along the cable. Feedforward amplifiers are described, for example, in Blumenkranz U.S. Pat. No. 4,472,725 entitled "LC Delay Line for Feedforward Amplifier", Tarbutton et al U.S. Pat. No. 4,617,522 entitled "Temperature Regulated Feedforward Amplifier", Mannerstrom U.S. Pat. No. 4,625,178 entitled "Feedforward Gain Block with Mirror Image Error Amplifier", and Blumenkranz et al U.S. Pat. No. 4,792,751 entitled "Apparatus for Field Testing the Performance of a Feedforward Amplifier".

In the operation of a feedforward amplifier, a signal component representative of the distortion introduced by the amplifier is extracted from the amplified signal. That component is then typically phase inverted and the phase inverted distortion component is combined with the amplified signals. The phase inverted component cancels the distortion component in the amplified signal, leaving a relatively distortion free amplified signal for transmission along the cable.

Optical transmission systems provide a new problem in coping with distortion. In particular, harmonic distortion is a major limitation in analog amplitude modulated optical communication transmission systems. In order to maintain a desired carrier-to-noise ratio of at least 58 dB in a cable television communication system, for example, it is preferable to use external modulators to modulate an optical carrier with the communication signal. However, currently available external modulators, such as Mach Zehnder intensity modulators are nonlinear, due to the phase to intensity conversion process. Nonlinearities of the modulator result in odd order harmonic distortions, of which the third order components are most significant.

It would be advantageous to provide an apparatus and method for reducing harmonic distortion in an analog optical transmission system using an external modulator. Such an apparatus and method would have particular application in an AM cable television supertrunk distribution system. It would be further advantageous to provide such an apparatus and method that is economical, readily manufacturable, and reliable. The present invention provides such an apparatus and method.

SUMMARY OF THE INVENTION

In accordance with the present invention, a method and apparatus are provided for linearizing the output of an external analog optical modulator. The phase of a modulating signal is adjusted to compensate for phase shifts introduced by an external optical modulator and a distortion generator used to predistort the signal. The modulation signal is predistorted with odd order distortion components similar to but opposite in polarity than distortion components introduced by the modulator. The predistorted, phase shifted modulation signal is coupled to a modulating signal input of the external modulator.

In one embodiment of the invention, means are provided for splitting an input signal into first and second paths. Phase shift means are coupled to the first path for shifting the input signal phase. Distortion generator means are coupled to the second path for introducing distortion components into the input signal. The phase shifted input signal from the first path is combined with the distorted input signal from the second path to provide a predistorted signal for use in modulating a light source. A variable gain amplifier is coupled to amplify the distortion components in the predistorted signal to a desired level. The phase shift means may also be adjustable to provide a desired phase delay. The variable gain amplifier for amplifying the distortion components is coupled in the second path between the distortion generator means and the combining means. An attenuator may be coupled to the input of the amplifier.

In an alternate embodiment, the variable gain amplifier is coupled to amplify the predistorted signal provided by the combining means. In this embodiment, the combining means can subtract the phase shifted input signal from the distorted input signal to provide a predistorted signal that primarily comprises the distortion components. The amplified, predistorted signal from the combining means is then summed with the input signal to provide a modulation signal for the light source. The input signal may also be amplified prior to summation with the amplified predistorted signal.

In either embodiment, the light source can comprise a solid state laser. The external modulator can comprise a Mach Zehnder modulator. The distortion generator means provide odd order distortion components that are opposite in polarity to the odd order distortion components introduced by the external modulator.

In particular, the distortion generator means can comprise a diode pair coupled with opposite polarities in parallel. Each diode is forward biased with a respective current source. The biased diode pair is coupled in series with the second path to distort the input signal.

DETAILED DESCRIPTION OF THE INVENTION

External modulators, such as Mach Zehnder modulators are useful in modulating an optical carrier, such as a laser beam, with a communication signal for analog transmission. External modulation is desirable for analog lightwave distribution because a high powered diode pump laser can be used to achieve good power budget. In addition, intermodulation distortion is independent of frequency.

One problem with external modulators is that they are nonlinear, and the level of nonlinearities vary from device to device. The present invention provides a universal predistortion circuit for linearizing an optical intensity modulator. Both phase and amplitude adjustment of the modulating signal are provided to enable the circuit to adapt to any external modulator.

Figure 1:
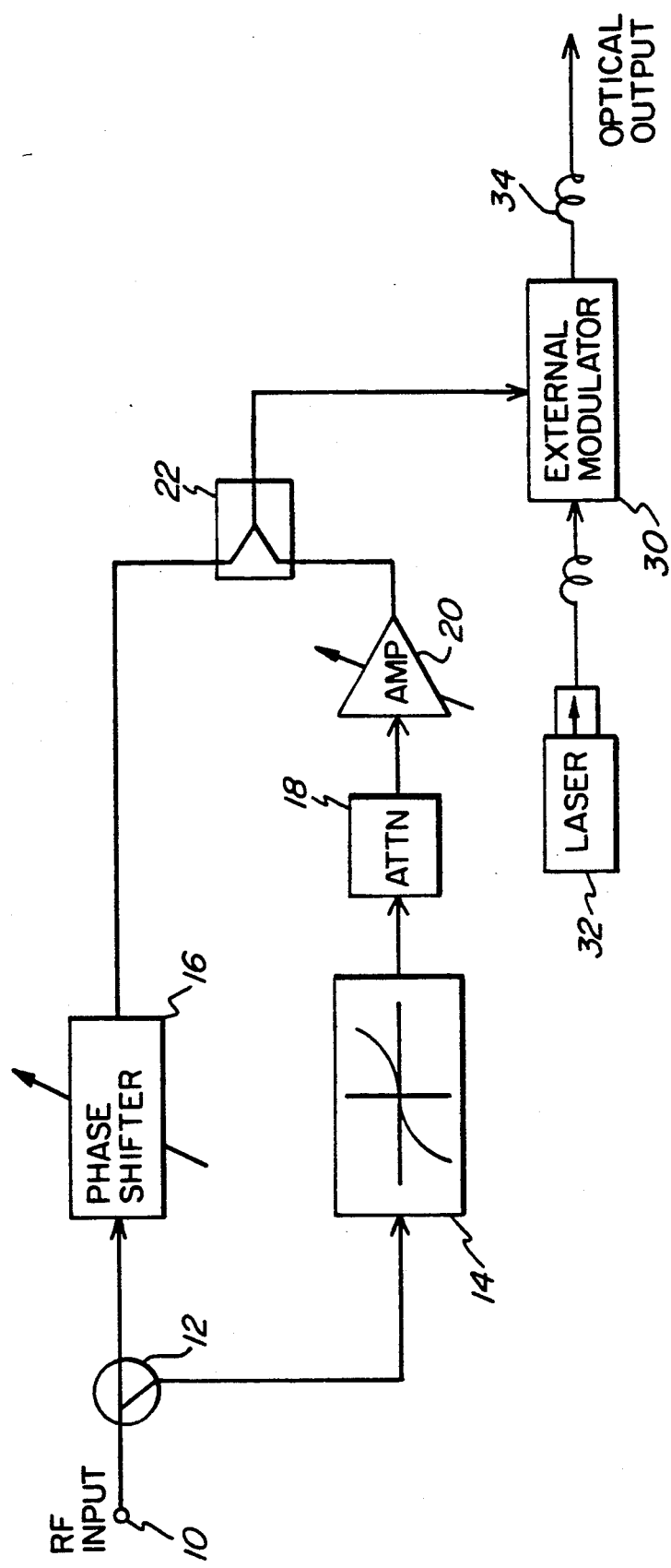
FIG. 1 is a block diagram of a first embodiment of the present invention.

FIG. 1 illustrates one embodiment of a predistortion circuit in accordance with the present invention. An RF input signal, such as a cable television ("CATV") signal is input at terminal 10. The signal is split into two paths at a conventional directional coupler 12. In the first path, the phase of the signal is shifted by an adjustable phase shifter 16. In the second path, the signal is distorted by a distortion generator 14 that can comprise a pair of diodes coupled with opposite polarities in parallel. The current-voltage characteristic of such a diode pair is illustrated within box 14. The distorted signal output from distortion generator 14 is input to an attenuator 18, and an adjustable gain amplifier 20.

The phase shifted signal from the first path and distorted signal from the second path are combined in a conventional coupler 22 to produce a modulation signal for external modulator 30. Modulator 30, which can be a Mach Zehnder modulator or other optical modulator, modulates a coherent light beam from a laser 32 for transmission over an optical fiber 34.

The circuit illustrated in FIG. 1 provides an adaptive harmonic distortion generator. It is designed to produce distortion components that are similar, but opposite in phase to those produced by external modulator 30. Phase shifter 16 and amplifier 20 are adjusted (e.g., by trial and error) to provide a phase delay and amplitude that result in an optimal linearization of the output from modulator 30. Amplifier 20 serves to set the level of distortion according to the modulation depth used to modulate optical modulator 30.

It should be appreciated that the level of distortion components introduced by distortion generator 14 do not have to be exactly the same as those produced by modulator 30. The only requirement on the distortion generator is to generate harmonic distortion components that have a similar order as those produced by the external modulator. Since external modulators generally introduce odd order harmonics, distortion generator 14 also generates odd order harmonics.

Figure 2:
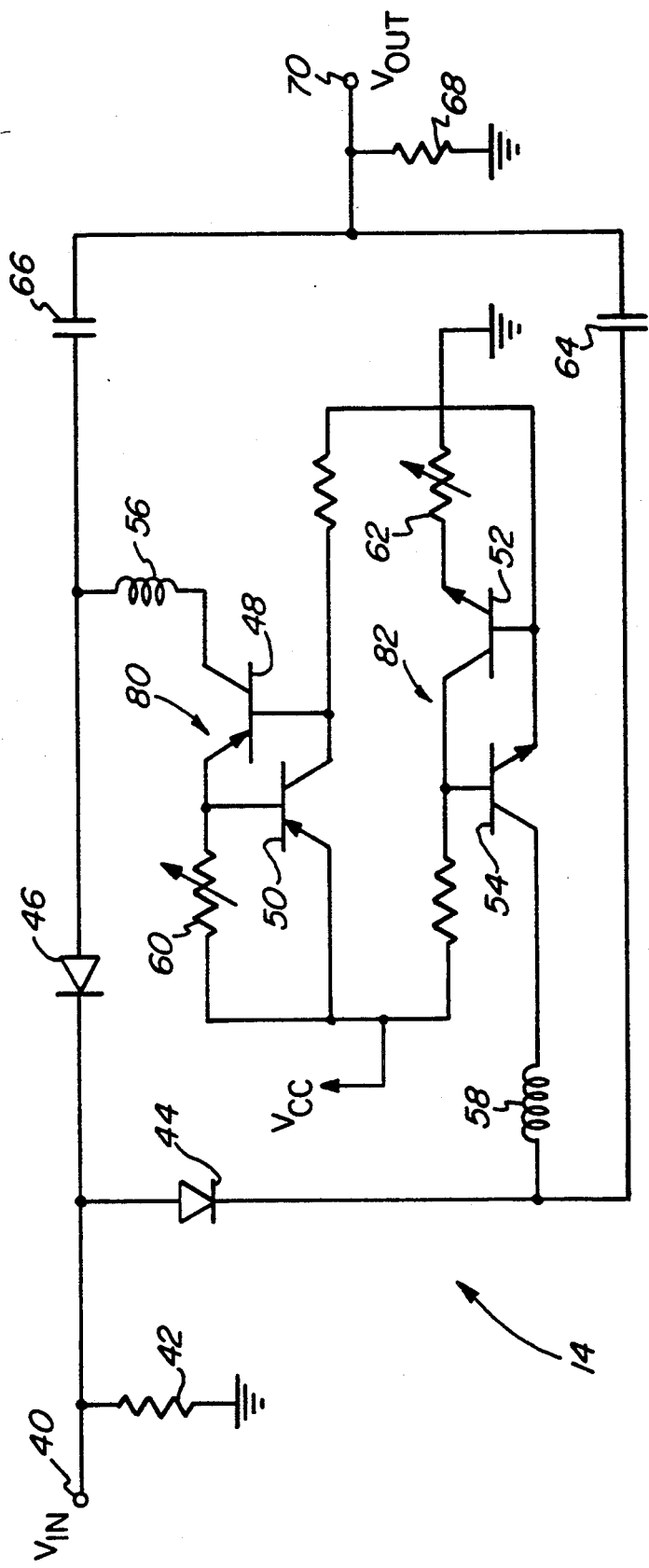
FIG. 2 is a schematic diagram of a parallel diode distortion generator that can be used in connection with the present invention.

FIG. 2 is a schematic diagram of a diode pair distortion generator that can be used in connection with the present invention. An input signal is coupled via terminal 40 to the anode of diode 44 and the cathode of diode 46. Resistor 42 provides a proper input impedance. Diode 46 is forward biased by a current source generally designated 80. The current source includes a conventional transistor pair 48, 50 with a potentiometer 60 to enable adjustment of the output current. Current is applied through a choke 56 that blocks AC components of the input signal from feeding back into the current source.

A similar current source 82 is used to forward bias diode 44. This source includes transistor pair 52, 54 with potentiometer 62 that is used to adjust the output current. A choke 58 prevents AC components of the input signal from feeding back into the current source. Capacitors 64, 66 block the DC bias currents from feeding through with the distorted signal to output terminal 70. The output impedance of the circuit is established by resistor 68.

Figure 3:
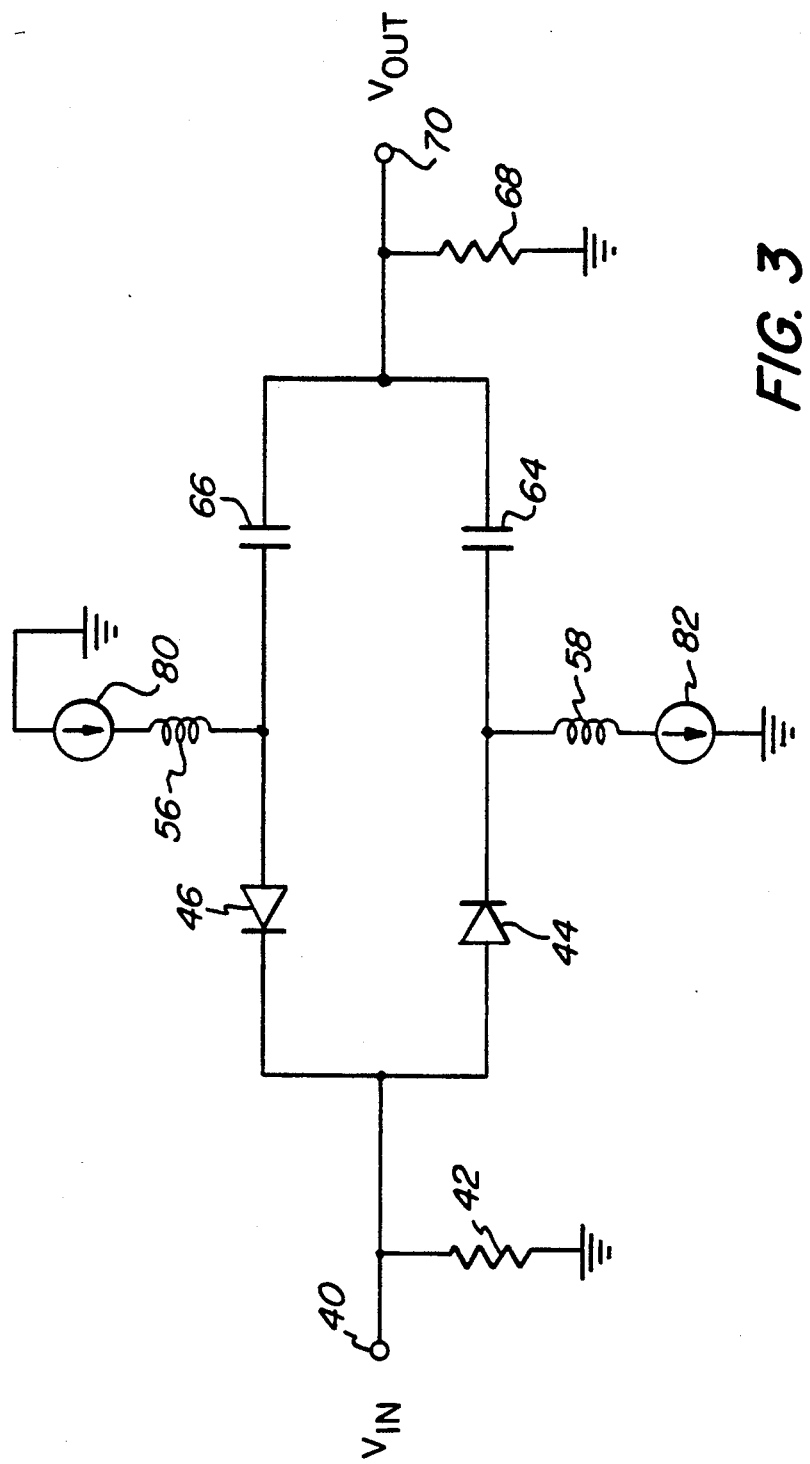
FIG. 3 is an equivalent circuit of the distortion generator of FIG. 2.

FIG. 3 is a simplified diagram of the circuit of FIG. 2. Similarly numbered components provide the functions described above in connection with FIG. 2.

The response of the diode pair circuit can be expressed mathematically as:

$$V_O = 2R_L I_B [V_T V_{IN}/(1+2V_T I_B(R_S+R_L)) + (V_T V_{IN})^3/6(1+2V_T I_B(R_S+R_L))^4 + \ldots]$$

Where:
$V_O$ = Output Voltage
$R_L$ = Load Impedance
$I_B$ = Diode Bias Current
$V_T$ = Diode Threshold Voltage (Q/kT)
$R_S$ = Input Impedance
$V_{IN}$ = Input Voltage Similarly, the response of an external optical modulator can be expressed as:

$$P_O = P_B[(KV_M - (KV_M)^3/8)\sin wt + ((KV_M)^3/24)\sin 3wt + \ldots]$$

Figure 4A:
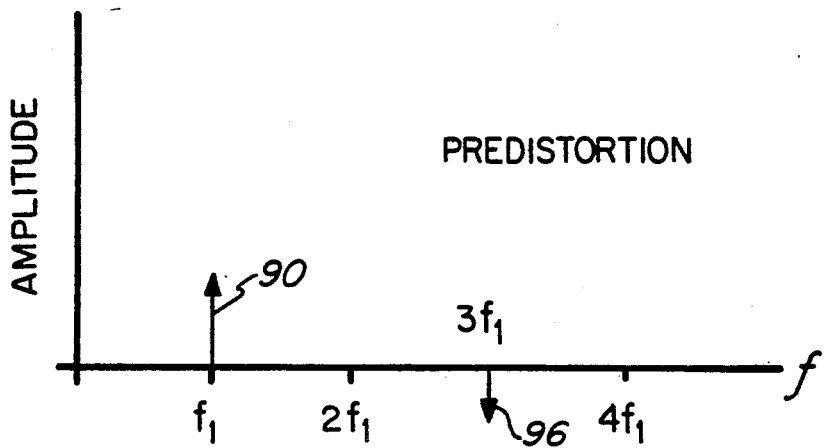
FIGS. 4a–4c are spectral patterns of the distortion introduced by a predistortion circuit, an external modulator, and the combination thereof.
Figure 4B:
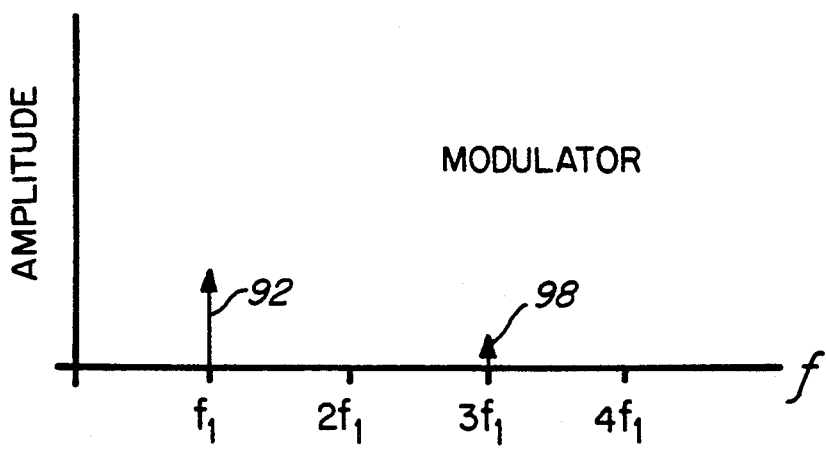
Figure 4C:
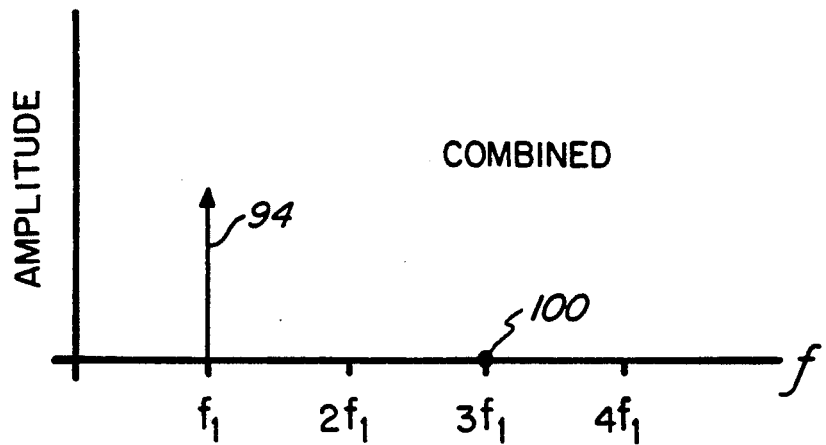

Where:
$P_O$ = Optical Output Power
$P_B$ = Optical Bias Power
K = Unique Constant for Each Different Modulator
$V_M$ = Modulating Signal FIGS. 4a–4c are spectral responses, respectively, of signals passing through the distortion generator, external modulator, and the combined signals. As indicated in FIG. 4a, an input signal with a frequency $f_1$ passes through the distortion generator with a spectral response 90. The distortion generator introduces a third order harmonic at 3 $f_1$ as shown at 96. The response of the external modulator, as indicated in FIG. 4b, is such that the signal frequency $f_1$ passes with a response 92 in the same direction as the response 90 through the distortion generator. However, third order harmonics generated at 3 $f_1$ have a response 98 opposite in polarity to those introduced by the distortion generator. As a result, when the modulator is modulated with a signal passed through the distortion generator, an output spectra as illustrated in FIG. 4c will result. In particular, the desired signal spectra at $f_1$ add with a response as shown at 94. The third order harmonics cancel as indicated at 100.

Figure 5:
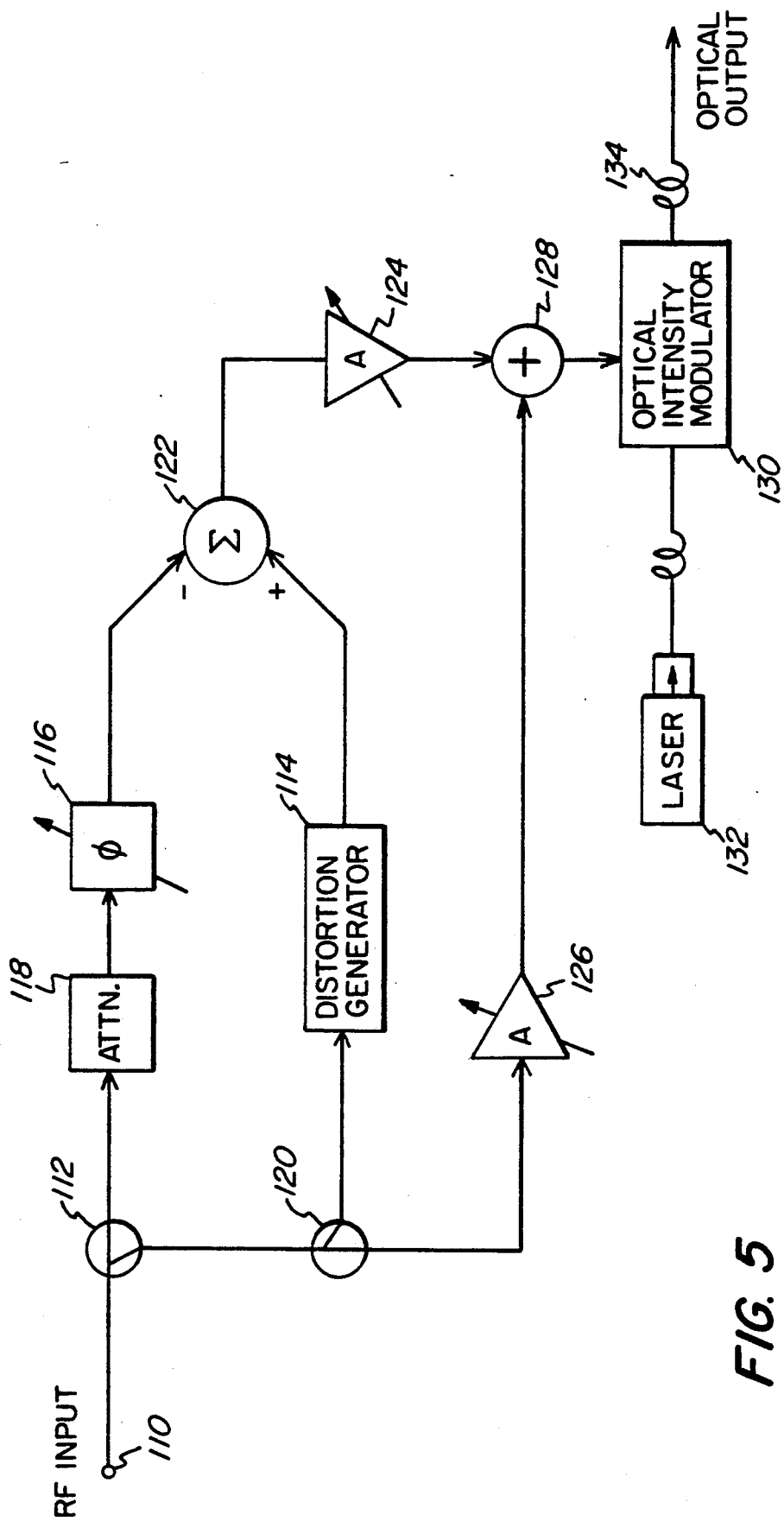
FIG. 5 is a block diagram of a second embodiment in accordance with the present invention.

An alternate embodiment of a predistortion circuit in accordance with the present invention is illustrated in FIG. 5. The RF input signal applied at terminal 110 is coupled to a directional coupler 112 that splits the signal into first and second paths. In the first path, the signal is attenuated at a conventional attenuator 118 and passed to an adjustable phase shift circuit 116. In the second path, the RF input signal is again split at a directional coupler 120. One output of coupler 120 couples the signal to a distortion generator 114 that can comprise the circuit illustrated in FIG. 2. The phase shifted input signal from phase shifter 116 is subtracted at a combiner 122 from the distorted input signal from distortion generator 114. The output of combiner 122 contains the distortion components introduced by distortion generator 114.

The distortion components output from combiner 122 are amplified by a variable gain, low noise linear amplifier 124 and summed in a summer 128 with the original RF input signal after amplification by another variable gain amplifier 126. The gains of amplifiers 124, 126 and the phase delay introduced by phase shifter 116 are set to optimize the linearization of an optical intensity modulator 130. The combined signal from summer 128 is used as a modulation signal for the modulator, which modulates an optical output signal from laser 132 for transmission on an optical fiber 134.

It should now be appreciated that the present invention provides a universal predistortion circuit that is useful in linearizing the output of an optical intensity modulator. The circuit is useful in broadband multichannel transmission systems, such as CATV distribution systems. The use of a predistorted modulation signal in conjunction with a conventional optical intensity modulator effectively reduces the third order nonlinearity generated by the modulator. As a result, a higher optical modulation index can be used resulting in a higher link power budget for a given source of optical power. By adjusting the phase delay and amplitude of the modulating signal, the intrinsic third order composite triple beats of the modulator are reduced.

Although the invention has been described in connection with various preferred embodiments, those skilled in the art will appreciate that numerous adaptations and modifications may be made thereto without departing from the spirit and scope of the invention, as set forth in the following claims.

What is claimed is:

1. External optical intensity modulator apparatus having reduced third order distortion products comprising:
    means for splitting an analog input signal into first and second paths;
    phase shift means coupled to said first path for shifting the input signal phase;
    distortion generator means coupled to said second path for introducing distortion components into said input signal;
    means for combining the phase shifted input signal from said first path with the distorted input signal from said second path to provide a predistorted analog modulation signal; and
    an external optical intensity modulator having an input for receiving said predistorted analog modulation signal for use in modulating a light source.

2. Apparatus in accordance with claim 1 wherein said distortion generator means comprise:
    a diode pair coupled with opposite polarities in parallel;
    a first current source for forward biasing one of said diodes;
    a second current source for forward biasing the other of said diodes; and
    means for coupling said diode pair in series with said second path.

3. Apparatus in accordance with claim 1 wherein said phase shift means is adjustable to provide a desired phase delay.

4. Apparatus in accordance with claim 1 further comprising:
    a variable gain amplifier coupled to adjustably amplify said distortion components.

5. Apparatus in accordance with claim 4 wherein said phase shift means is adjustable to provide a desired phase delay.

6. Apparatus in accordance with claim 5 wherein said distortion generator means comprise:
    a diode pair coupled with opposite polarities in parallel;
    a first current source for forward biasing one of said diodes;
    a second current source for forward biasing the other of said diodes; and
    means for coupling said diode pair in series with said second path.

7. Apparatus in accordance with claim 4 wherein said variable gain amplifier is coupled in said second path between said distortion generator means and said combining means.

8. Apparatus in accordance with claim 7 further comprising:
    an attenuator coupled between said distortion generator means and said amplifier.

9. Apparatus in accordance with claim 4 wherein said variable gain amplifier is coupled to amplify the predistorted signal provided by said combining means.

10. Apparatus in accordance with claim 9 wherein said combining means subtracts the phase shifted input signal from the distorted input signal to provide a predistorted signal comprising primarily said distortion components.

11. Apparatus in accordance with claim 10 further comprising:
    means for summing said input signal with the distortion components from the combining means to provide said analog modulation signal.

12. Apparatus in accordance with claim 11 further comprising:
    amplifier means for amplifying said input signal prior to summation with said distortion components.

13. Apparatus in accordance with claim 1 wherein said combining means add the phase shifted input signal to the distorted input signal to provide said predistorted analog modulation signal.

14. Apparatus in accordance with claim 13 wherein said external optical intensity modulator is a Mach Zehnder modulator for modulating said light source.

15. Apparatus in accordance with claim 1 wherein said external optical intensity modulator is a Mach Zehnder modulator for modulating said light source.

16. Apparatus in accordance with claim 1 wherein said distortion generator means provide odd order distortion components.

17. A method for linearizing the output of an external analog optical modulator comprising the steps of:
providing an analog modulating signal for use in modulating an external optical modulator;
adjusting the phase of said modulating signal in a first path to compensate for a phase shift introduced by said modulator;
predistorting said modulation signal in a second path with odd order distortion components similar to but opposite in polarity than distortion components introduced by said modulator;
combining the phase adjusted modulating signal from said first path with the predistorted modulation signal from said second path to provide a predistorted, phase shifted signal; and
coupling said predistorted, phase shifted signal to a modulating signal input of said modulator.

* * * * *